(12) United States Patent  
Van Bommel et al.

(10) Patent No.: US 10,969,067 B2  
(45) Date of Patent: Apr. 6, 2021

(54) LIGHT EMITTING DEVICE HAVING FLEXIBLE SUBSTRATE WITH PLURALITY OF FOLDS

(71) Applicant: SIGNIFY HOLDING B.V., Eindhoven (NL)

(72) Inventors: Ties Van Bommel, Horst (NL); Rifat Ata Mustafa Hikmet, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/481,058

(22) PCT Filed: Dec. 21, 2017

(86) PCT No.: PCT/EP2017/084218  
§ 371 (c)(1),  
(2) Date: Jul. 25, 2019

(87) PCT Pub. No.: WO2018/137869  
PCT Pub. Date: Aug. 2, 2018

(65) Prior Publication Data  
US 2020/0003374 A1  Jan. 2, 2020

(30) Foreign Application Priority Data

Jan. 30, 2017 (EP) .................................. 17153679

(51) Int. Cl.  
*H05K 1/02* (2006.01)  
*F21S 4/24* (2016.01)  
*F21Y 103/10* (2016.01)  
*F21Y 115/10* (2016.01)  
*F21Y 107/70* (2016.01)

(52) U.S. Cl.  
CPC ............. *F21S 4/24* (2016.01); *F21Y 2103/10* (2016.08); *F21Y 2107/70* (2016.08); *F21Y 2115/10* (2016.08)

(58) Field of Classification Search  
CPC .. H05K 1/028; H05K 1/0277; F21Y 2103/10; F21Y 2105/00; F21Y 2105/10  
See application file for complete search history.

(56) References Cited

U.S. PATENT DOCUMENTS 2,911,605 A * 11/1959 Wales, Jr. ............ H01F 17/0006  
336/200  
3,894,225 A * 7/1975 Chao ...................... G09F 13/28  
362/249.08

(Continued)

FOREIGN PATENT DOCUMENTS

CN        2602251 Y    2/2004  
CN      203115592 U    8/2013  
(Continued)

*Primary Examiner* — Ismael Negron  
(74) *Attorney, Agent, or Firm* — Daniel J. Piotrowski

(57) ABSTRACT

A light emitting device includes a flexible substrate, a plurality of LEDs arranged on the flexible substrate to emit light in a main direction perpendicular to both a longitudinal direction and a transversal direction of the flexible substrate a plurality of folds provided such that the flexible substrate is folded resulting in the main direction in which the light from at least one LED is rotated around the longitudinal axis or the transversal axis of the flexible substrate over a desired angle θ.

13 Claims, 4 Drawing Sheets

(56) References Cited

U.S. PATENT DOCUMENTS

| | | | | |
|---|---|---|---|---|
| 4,761,720 | A * | 8/1988 | Solow | F21V 21/0808 362/235 |
| 6,299,337 | B1 * | 10/2001 | Bachl | H01L 25/13 362/545 |
| 6,619,831 | B2 * | 9/2003 | Kanesaka | B60Q 7/00 362/103 |
| 6,659,623 | B2 * | 12/2003 | Friend | F21V 21/002 250/504 R |
| 6,673,293 | B1 * | 1/2004 | Mistopoulos | F21V 23/06 264/149 |
| 8,593,390 | B2 * | 11/2013 | Plotz | F21K 9/00 345/102 |
| 8,619,211 | B2 * | 12/2013 | Bertram | F21K 9/00 349/61 |
| 9,117,991 | B1 | 8/2015 | Olson et al. | |
| 9,696,019 | B2 * | 7/2017 | Palfreyman | F21V 21/14 |
| 2010/0220046 | A1 | 9/2010 | Ploetz et al. | |
| 2010/0277666 | A1 | 11/2010 | Bertram et al. | |
| 2014/0268779 | A1 * | 9/2014 | Sorensen | F21K 9/232 362/249.06 |
| 2015/0108530 | A1 | 4/2015 | Roberts | |
| 2015/0233534 | A1 | 8/2015 | Kaiser et al. | |
| 2015/0260361 | A1 * | 9/2015 | Cho | F21V 31/005 362/249.04 |
| 2015/0276189 | A1 | 10/2015 | Palfreyman et al. | |
| 2015/0354797 | A1 * | 12/2015 | Luo | H05K 1/028 362/223 |

FOREIGN PATENT DOCUMENTS

| | | |
|---|---|---|
| CN | 103712100 A | 4/2014 |
| CN | 103945634 A | 7/2014 |
| CN | 203691737 U | 7/2014 |
| CN | 205048218 U | 2/2016 |
| CN | 205535230 U | 8/2016 |
| DE | 102015206808 A1 | 10/2016 |
| EP | 3094161 A1 | 11/2016 |
| FR | 2853447 A1 | 10/2004 |
| WO | 2008/031580 A1 | 3/2008 |
| WO | 2012136033 A1 | 10/2012 |
| WO | 2014026888 A1 | 2/2014 |
| WO | 2015058565 A1 | 4/2015 |

* cited by examiner

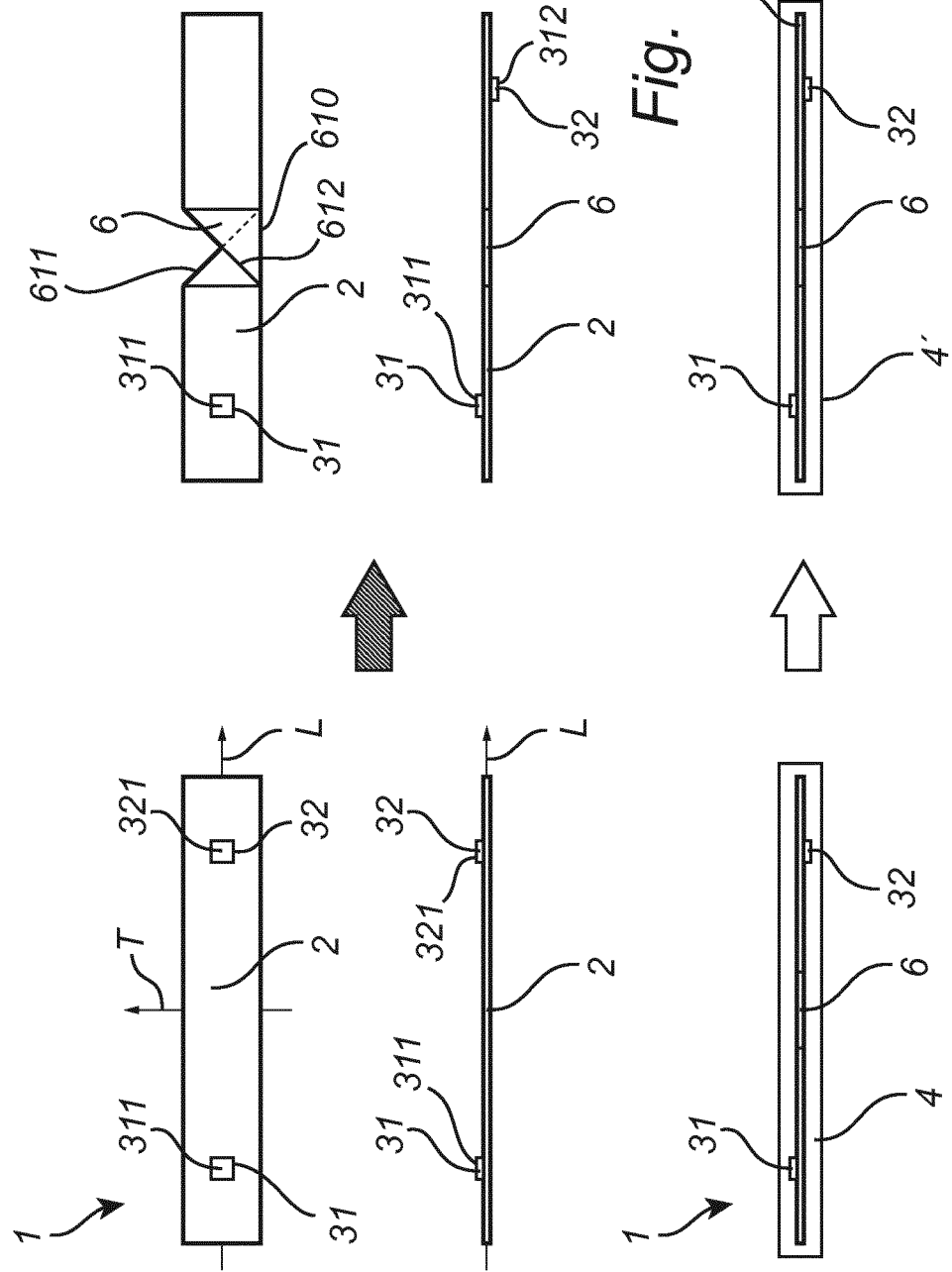

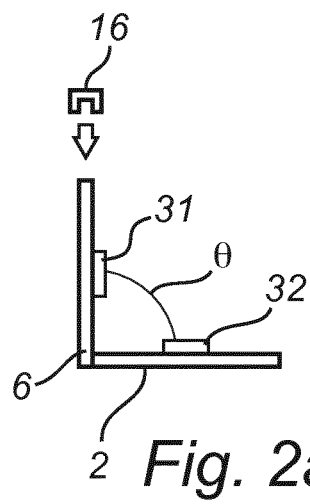
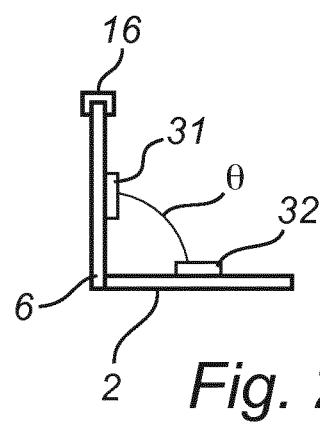
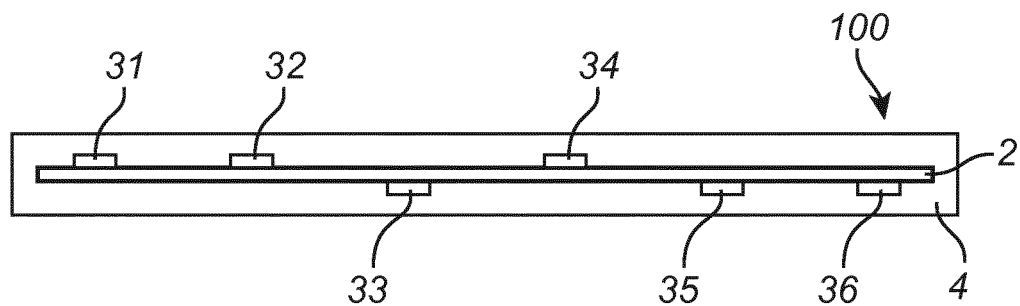
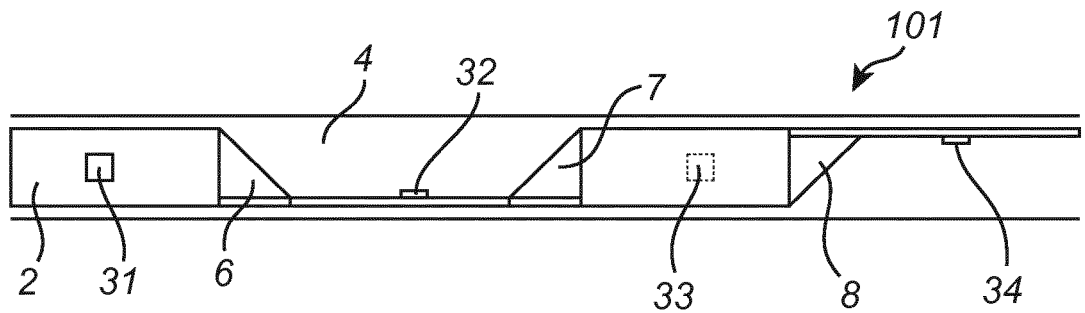
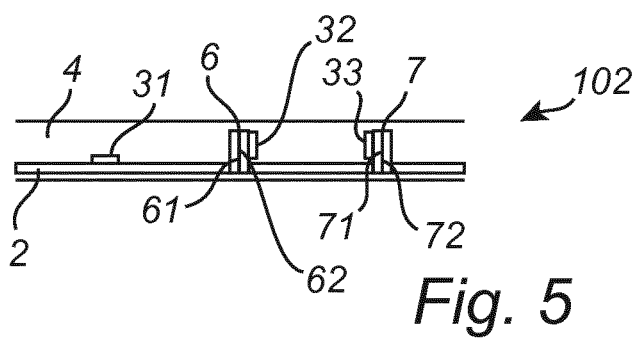

LIGHT EMITTING DEVICE HAVING FLEXIBLE SUBSTRATE WITH PLURALITY OF FOLDS

FIELD OF THE INVENTION

The invention relates to a light emitting device comprising a flexible substrate and a plurality of LEDs being arranged on the flexible substrate in such a way as to extend in a longitudinal direction.

The invention further relates to a method for manufacturing such a light emitting device.

BACKGROUND OF THE INVENTION

Increasingly more LED strips are used in various lighting applications such as in retail and home. In some cases such strips are enclosed in flexible polymers such as silicone.

For instance, US 2010/0277666 A1 discloses a lighting arrangement with a light module that has at least one first group of light sources and one second group of light sources that are arranged spaced apart from each other on a flexible circuit board, and with a carrier on which the light module is mounted, and a buffer zone that laterally overlaps with the light module between the first and the second group of light sources.

For instance, US 2015/0233534 A1 describes optoelectronic component device comprising a mechanically flexible substrate with a plurality of LED light sources. The substrate is in an embodiment deformed such as to form a ring shaped structure with the LEDs facing towards a center of the ring, the ring shaped structure comprising a central cavity. In some embodiments, the mechanically flexible substrate may be arranged on a second substrate. An encapsulation element may be arranged in the beam path of the LEDs to protect the LEDs from e.g. moisture and corrosive gases. The encapsulation element may in some embodiments be filled with a formable substance, such as an epoxy, for improved mechanical stability.

However, in the known solutions the LEDs are arranged on the same side of the substrate. In applications where the illumination direction needs to be different, such as illumination to both sides or at an angle of 90 degrees with respect to other different kind of LEDs, positioning of the LEDs on different sides of the carrier is necessary.

Furthermore, as is the case in the above-mentioned lighting structure, an amount of play with respect to the position of the light sheet will be left in the known solutions due to the structure thereof, leaving the lighting structure structurally unstable over time.

SUMMARY OF THE INVENTION

It is an object of the present invention to overcome this problem, and to provide a light emitting device with which additional illumination directions, such as illumination to both sides or at an angle of 90 degrees with respect to other different kind of LEDs, are made possible.

Furthermore, it is an object of the invention to provide such a light emitting device which is structurally stable over time such that the position of the LEDs will remain the same during the time of use of the light emitting device.

According to a first aspect of the invention, this and other objects are achieved by means of a light emitting device comprising a flexible substrate comprising a longitudinal direction, a longitudinal axis extending in the longitudinal direction, a transversal direction and a transversal axis extending in the transversal direction, and a plurality of LEDs adapted for, in operation, emitting light, and being arranged on the flexible substrate in such a way as to extend in a longitudinal direction parallel with the longitudinal axis of the flexible substrate, each LED of the plurality of LEDs comprising a respective light output surface arranged facing in a main direction, the main direction extending perpendicular to both the longitudinal direction and the transversal direction of the flexible substrate, the flexible substrate being provided with at least one fold combination arranged in at least one predetermined position, the fold combination comprising at least two folds provided in such a way that the extension of the plurality of LEDs in the longitudinal direction is maintained and that the main direction in which the light output surface of at least one LED of the plurality of LEDs faces is rotated around the longitudinal axis of the flexible substrate over an angle θ with respect to the main direction in which the light output surface of at least one other LED of the plurality of LEDs faces, and the pitch between two adjacent LEDs of the plurality of LEDs is decreased.

As used herein, the terms "folded" and "folding" are intended to mean that the flexible substrate is provided with a fold, in particular in such a manner that at least two surface segments of the flexible substrate, particularly at least two surface segments of the same surface of the flexible substrate, are brought into contact with one another.

As used herein the term "fold combination" is intended to encompass a combination of any two or more folds provided in the same predetermine position on the flexible substrate such as to provide the flexible substrate with a certain desired orientation.

As used herein, the term "valley fold" is intended to bear the meaning with which the term is used in origami, i.e. a fold where the crease is at the bottom and the substrate is folded onto itself, such that if unfolded the substrate forms a V-shape.

As used herein, the term "mountain fold" is intended to bear the meaning with which the term is used in origami, i.e. a fold where the crease is at the top and the substrate is folded onto itself, such that if unfolded the substrate forms an inverted V-shape or in other words a Λ-shape.

As used herein, the term "oblique fold" is intended to mean a fold which is oblique with respect to at least one of a longitudinal axis and a transversal axis of the flexible substrate.

As used herein, the terms "freeze" and "fix" are intended to mean that the feature being frozen or fixed is kept substantially or completely unchanged over time, especially over the life time of the light emitting device. In other words, the feature being frozen or fixed is left with no or virtually no play or room to move.

As used herein, the term "rigid" is intended to mean unable to bend or be forced out of shape, and in other words not flexible.

By providing the flexible substrate with at least one fold combination arranged in at least one predetermined position, the fold combination comprising at least two folds provided in such a way that the extension of the plurality of LEDs in the longitudinal direction is maintained and that the main direction in which the light output surface of at least one LED of the plurality of LEDs faces is rotated around the longitudinal axis of the flexible substrate over an angle θ with respect to the main direction in which the light output surface of at least one other LED of the plurality of LEDs faces, and the pitch between two adjacent LEDs of the plurality of LEDs is decreased, a light emitting device is provided with which additional illumination axes, such as illumination to both sides or at an angle of 90 degrees with respect to the other LEDs, and/or different intensities along the longitudinal direction of the flexible foil is made possible.

Furthermore, by providing the flexible substrate with a fold combination as described above, a light emitting device is provided with which the position of the LEDs will remain stable over time. Thereby, the light distribution of the light emitted by the light emitting device remains constant over time for all directions in which light is emitted, which is important both to provide optimum lighting in many applications and to satisfy the aesthetical demands of the customers.

In an embodiment the fold combination with which the flexible substrate is provided comprises two folds in the form of one mountain fold and one valley fold provided in such a way that at least two surface segments of the same surface of the flexible substrate are brought into mutual contact, and that the pitch between two adjacent LEDs of the plurality of LEDs is decreased.

Thereby, and in particular as the fold combination is provided with two folds in the form of one mountain fold and one valley fold provided in such a way that at least two surface segments of the same surface of the flexible substrate are brought into mutual contact, a light emitting device is provided with which not only different intensities along the longitudinal direction of the flexible foil is made possible, but with which also the folded flexible substrate is provided with an improved stability over time.

The fold combination with which the flexible substrate is provided comprises at least three folds provided in such a way that at least two surface segments of the same surface of the flexible substrate are brought into mutual contact, such that the main direction in which the light output surface of at least one LED of the plurality of LEDs faces is rotated around the longitudinal axis of the flexible substrate.

Thereby, and in particular as the fold combination is provided with at least three folds provided in such a way that at least two surface segments of the same surface of the flexible substrate are brought into mutual contact, a light emitting device is provided with which not only additional illumination axes is made possible, but with which the folded flexible substrate is also provided with an improved stability over time.

In an embodiment the fold combination with which the flexible substrate is provided comprises at least three folds including at least one mountain fold and at least one valley fold, and wherein at least two of the said at least three folds are oblique folds.

Thereby a light emitting device is provided with which the position of the LEDs will remain particularly stable over time.

In an embodiment the angle θ is any one of 30°, 45°, 60°, 90°, 120°, 135°, 150° 180°, 270° and 360°.

Thereby a light emitting device is provided which enables emission of light in a forward direction, a backward direction and/or any of two or more sideward directions simultaneously. Such a configuration is particularly useful and desired in many practical applications.

In an embodiment the flexible substrate is provided with at least two fold combinations arranged in at least two different predetermined positions in such a manner that the main direction in which the light output surface of at least some of the LEDs of the plurality of LEDs faces is rotated around the longitudinal axis of the flexible substrate over an angle θ with respect to the main direction in which the light output surface of at least one other LED of the plurality of LEDs faces in an alternating manner.

Thereby a light emitting device is provided with which several additional illumination directions, such as illumination to both sides and at an angle of 90 degrees with respect to the other LEDs, is made possible. Furthermore, a light emitting device is provided with which an even illumination may be provided in at least two different directions simultaneously.

In an embodiment the flexible substrate is provided with at least two fold combinations arranged in at least two different predetermined positions in such a manner that the main direction in which the light output surface of at least some of the LEDs of the plurality of LEDs faces is rotated around the longitudinal axis of the flexible substrate over an angle θ with respect to the main direction in which the light output surface of at least one other LED of the plurality of LEDs faces in an alternating manner, and/or the light emitted by the light emitting device is provided with a gradient in distribution.

Thereby a light emitting device is provided with which an illumination which varies along the longitudinal axis of the flexible strip is provided.

In an embodiment the flexible substrate comprises any one of at least one perforation and at least one recess, and the flexible substrate is provided with such a fold combination that at least one LED of the plurality of LEDs mounted on the flexible substrate is positioned in the at least one perforation or the at least one recess.

Thereby a light emitting device is provided in which the flexible substrate may be folded in a particularly simple manner using only a very little amount of the flexible substrate when folding it necessary. This in turn also provides for a folding process being particularly simple.

In an embodiment the flexible substrate with the LEDs mounted thereon and provided with the at least one fold combination in the at least one predetermined position is encapsulated in a first rigid polymer encapsulation in such a manner that the first rigid polymer encapsulation freezes or fixes the flexible substrate including the fold combination.

Thereby a light emitting device is provided with which the position of the LEDs will remain stable over time and in particular over the whole life time of the light emitting device. And thereby, the light distribution of the light emitted by the light emitting device remains constant over time, and in particular over the whole life time of the light emitting device, for all directions in which light is emitted, which is important both to provide optimum lighting in many applications and to satisfy the aesthetical demands of the customers.

In an embodiment the folded flexible substrate with the LEDs mounted thereon is embedded in the first rigid polymer encapsulation.

Thereby a light emitting device is provided with which the position of the LEDs will remain particularly stable over time and in particular over the whole life time of the light emitting device, and which is furthermore very durable.

In an embodiment the first rigid polymer encapsulation encapsulates or embeds the folded flexible substrate with the LEDs mounted thereon on all sides.

Thereby a light emitting device is provided with which the position of the LEDs will remain particularly stable over time and in particular over the whole life time of the light emitting device, while the first rigid encapsulation simultaneously may serve as a protective layer protecting the LEDs.

In an embodiment the first rigid polymer encapsulation is made of an acrylate cured by exposure to UV light or of a silicone cured by exposure to heat.

Such materials have particularly good characteristics with regard to both rigidity and especially transparency to the light emitted by the LEDs such as to interfere minimally with the light emitted by the light emitting device.

In an embodiment the first rigid polymer encapsulation comprises any one or more of a scattering material and a phosphor material and a reflective material.

Providing a scattering material has the advantage of enabling the provision of a more uniform distribution of the light emitted by the light emitting device.

Providing a phosphor material enables conversion of at least a part of the light emitted by the LEDs while propagating through the first rigid polymer encapsulation, which in turn enables tuning the spectral distribution of the light emitted by the light emitting device.

Providing a reflective material provides a further means of control of the direction in which the light emitting device emits light as well as of the intensity of the light emitted by the light emitting device.

In an embodiment the light emitting device further comprises a second rigid polymer encapsulation encapsulating the first rigid polymer encapsulation, the first rigid polymer encapsulation and the second rigid polymer encapsulation comprising different material properties.

Thereby a light emitting device is provided with which the first rigid polymer encapsulation is protected by the second rigid polymer encapsulation, thus making the light emitting device even more durable. Furthermore, a light emitting device is provided having more degrees of freedom in modifying the light emitted by the LEDs before emission from the light emitting device.

In an embodiment the first rigid polymer encapsulation is embedded in the second rigid polymer encapsulation.

Thereby a light emitting device is provided with which the whole first rigid polymer encapsulation is protected and with which the position of the LEDs will remain particularly stable over time and in particular over the whole life time of the light emitting device, and which is furthermore very durable.

In an embodiment the second rigid polymer encapsulation, is made of an acrylate cured by exposure to UV light or of a silicone cured by exposure to heat.

Such materials have particularly good characteristics with regard to both rigidity and especially transparency to the light emitted by the LEDs such as to interfere minimally with the light emitted by the light emitting device.

In an embodiment the second rigid polymer encapsulation comprises any one or more of a scattering material and a phosphor material and a reflective material.

Providing a scattering material has the advantage of enabling the provision of a more uniform distribution of the light emitted by the light emitting device.

Providing a phosphor material enables conversion of at least a part of the light emitted by the LEDs while propagating through the first rigid polymer encapsulation, which in turn enables tuning the spectral distribution of the light emitted by the light emitting device.

Providing a reflective material provides a further means of control of the direction in which the light emitting device emits light as well as of the intensity of the light emitted by the light emitting device.

In an embodiment the flexible substrate comprises any one or more of a metal layer and a reflective layer.

Providing such a metal layer or reflective material not only provides a further means of control of the direction in which the light emitting device emits light as well as of the intensity of the light emitted by the light emitting device, but also lowers or minimizes the amount of light which would otherwise be absorbed by the flexible substrate and thus lost. Providing a metal layer on the flexible substrate may furthermore add to simplifying the folding of the flexible substrate by stabilizing the substrate in the folded orientation or condition.

In a second aspect the above and further objects are achieved by means of a method for manufacturing a light emitting device according to the invention, the method comprising the steps of providing a flexible substrate comprising a longitudinal direction, a longitudinal axis extending in the longitudinal direction, a transversal direction and a transversal axis extending in the transversal direction and a plurality of LEDs adapted for, in operation, emitting light, arranging the plurality of LEDs on the flexible substrate in such a way as to extend in a longitudinal direction parallel with the longitudinal axis of the flexible substrate, and in such a way that a main direction of a respective light output surface of each LED of the plurality of LEDs extends perpendicular to both the longitudinal direction and the transversal direction of the flexible substrate, and providing the flexible substrate with at least one fold combination arranged in at least one predetermined position, the fold combination comprising at least two folds provided in such a way that the extension of the plurality of LEDs in the longitudinal direction is maintained and that the main direction in which the light output surface of at least one LED of the plurality of LEDs faces is rotated around the longitudinal axis of the flexible substrate over an angle θ with respect to the main direction in which the light output surface of at least one other LED of the plurality of LEDs faces, and the pitch between two adjacent LEDs of the plurality of LEDs is decreased.

In an embodiment the method further comprises the step of encapsulating the folded flexible substrate with the LEDs mounted thereon and provided with the at least one fold combination in the at least one predetermined position in a first rigid polymer encapsulation in such a manner that the first rigid polymer encapsulation freezes or fixes the flexible substrate including the fold combination.

Further optional steps of the method according to the invention will appear from the following detailed description.

The invention furthermore, in a third aspect, concerns a lamp or a luminaire comprising a light emitting device according to the invention.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

FIG. 1A shows top and side views, respectively, of a first embodiment of a light emitting device according to the invention and comprising a flexible substrate and LEDs, before (left) and after (right) the flexible substrate is folded to be provided with a fold combination, respectively.

FIG. 1B shows the light emitting device according to FIG. 1A in a side view and further being provided with a rigid encapsulation before (left) and after (right) hardening or curing of the encapsulation, respectively.

FIGS. 2A and 2B are side views illustrating the folding of the flexible substrate of a light emitting device according to the invention by means of a clamping device such that the LEDs are positioned in a predetermined angle with respect to one another.

FIG. 3 shows a side view of a second embodiment of a light emitting device according to the invention.

FIG. 4 shows a side view of a third embodiment of a light emitting device according to the invention.

FIG. 5 shows a side view of a fourth embodiment of a light emitting device according to the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

Figure 6:
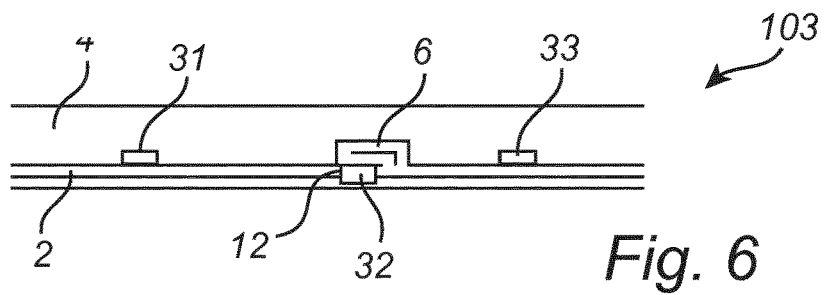
FIG. 6 shows a side view of a fifth embodiment of a light emitting device according to the invention.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

FIGS. 1A and 1B shows a first embodiment of a light emitting device 1 according to the invention illustrating various steps in the process of manufacture.

Generally, a light emitting device 1 according to the invention comprises a flexible substrate 2 with a longitudinal axis or direction L and a transversal axis or direction T, a plurality of LEDs 31, 32 and an optional first rigid encapsulation 4.

Generally, the flexible substrate 2 is folded around the longitudinal axis L and/or the transversal axis T and is thus provided with a fold combination 6 in at least one position to comprise a predetermined orientation. The fold combination generally comprises at least two folds. The flexible substrate 2 may be a foil, a strip, a band or the like being sufficiently flexible to be suitable for being folded.

The flexible substrate 2 generally comprises a length l measured in a direction parallel with the longitudinal axis L, a width w measured in a direction parallel with the transversal axis T and a thickness t measured in a direction perpendicular to both the longitudinal axis L and the transversal axis T. In an embodiment, the width w is at least 5 times the thickness t. In an embodiment, the width w is at least 8 times the thickness t. In an embodiment, the width w is at least 10 times the thickness t. The advantage of these embodiments is improved folding, the folding being improved more when the width is larger as compared to the thickness. The flexible substrate 2 may comprise multiple layers, e.g. 2 or 3 layers. In an embodiment, the thickness t of the flexible substrate is in the range from 0.01 to 3 mm. In an embodiment, the thickness t of the flexible substrate is in the range from 0.05 to 2 mm. In an embodiment, the thickness t of the flexible substrate is in the range from 0.1 to 1.5 mm. In an embodiment, the width w is in the range from 1 mm to 30 mm. In an embodiment, the width w is in the range from 2 mm to 25 mm. In an embodiment, the width w is in the range from 3 mm to 20 mm. In an embodiment, the length l is at least 10 times the width w. In an embodiment, the length l is at least 20 times the width w. In an embodiment, the length l is at least 25 times the width w, such as 50 times the width w or 100 times the width w. In an embodiment, the length l is in the range of 10 to 10,000 cm. In an embodiment, the length l is in the range of 50 to 1.000 cm. In an embodiment, the length l is in the range of 80 to 300 cm. For example, the thickness t is 1 mm, the width w is 1 cm and the length l is 2.5 m. The flexible foil 2 may comprise a polymer and/or a metal layer. The flexible foil 2 may also comprise an electrically conductive track or line. The electrically conductive track or line is connecting the LEDs of the plurality of LEDs 31, 32.

Generally, the LEDs of the plurality of LEDs 31, 32 may be connected in series, in parallel or in hybrid structures such as e.g. LEDs in a group of LEDs of the plurality of LEDs 31, 32 are connected in series and the groups of LEDs are connected in parallel. The light emitting device may comprise white LEDs or colored LEDs, or a combination thereof. The LEDs of the plurality of LEDs 31, 32 may differ in color or color temperature. For example, LEDs on one side may emit a first color or color temperature, the LEDs on the other side may emit light of a second color or color temperature, different from the first color or color temperature. The light emitting device in an embodiment emits white light. The white light is in an embodiment within 20 SDCM from the BBL. In another embodiment, the white light is within 15 SDCM from the BBL. In yet another embodiment, the white light is within 10 SDCM from the BBL. In an embodiment, the white light is having a color temperature in the range from 1,000 to 20,000 K. In an embodiment, the white light is having a color temperature in the range from 1,500 to 10,000 K. In an embodiment, the white light is having a color temperature in the range from 2,000 to 6,500 K. In an embodiment, the white light has a color rendering index of at least 70. In an embodiment, the white light has a color rendering index of at least 75. In an embodiment, the white light has a color rendering index of at least 80. The light emitting device may comprise a controller for controlling the LEDs of the plurality of LEDs 31, 32 or controlling two or more groups of LEDs of the plurality of LEDs 31, 32. The light emitting device may comprise a sensor for sensing e.g. light intensity, color or color temperature of the ambient light. The controller may control the LEDs according to the sensed light intensity, color or color temperature of the ambient light.

The left hand side of FIG. 1A illustrates the flexible substrate 2 before being provided with a fold combination 6 in one position and the right hand side of FIG. 1A illustrates the flexible substrate 2 after folding and thus being provided with a fold combination 6 in one position. Generally, a fold combination according to the invention comprises two or more folds, which may be any combination of valley folds and mountain folds and in principle even other types of folds, which may be straight folds or oblique folds as desired. The dimensions of the fold 6 may be varied, e.g.

such as to vary the distance between the LEDs to create a light intensity with local variations. Also, in other embodiments the flexible substrate 2 may be provided with two or more separate fold combinations in two or more separate positions.

The plurality of LEDs 31, 32 are mounted on the flexible substrate 2. The plurality of LEDs 31, 32 are adapted for, in operation, emitting light. The plurality of LEDs 31, 32 generally and irrespective of the embodiment comprise a respective light output surface 311, respectively 312, arranged facing in a main direction. The main direction is perpendicular to both the longitudinal axis L and the transversal axis T of the flexible substrate 2. The plurality of LEDs 31, 32 are generally arranged on the flexible substrate 2 in such a way as to extend in a longitudinal direction parallel with the longitudinal axis L of the flexible substrate 2. In FIGS. 1A and 1B two LEDs 31, 32 are provided. Any number of LEDs greater than two may be provided in other embodiments. The individual LEDs of the plurality of LEDs may be adapted for emitting light with the same spectral distribution, color and/or color temperature or light with two or more different spectral distributions, colors and/or color temperatures. Non-limiting examples are LEDs emitting blue, red, green or yellow light. Furthermore, the LEDs of the plurality of LEDs 31, 32 may be side emitting LEDs, top emitting LEDs or a combination of side and top emitting LEDs. Also, the LEDs of the plurality of LEDs 31, 32 may be driven in different ways, e.g. by powering all LEDs or only some, e.g. every other LED, at the time after a predetermined scheme.

The fold combination 6 shown in FIG. 1A comprises three folds, namely two valley folds 611, 612 and one mountain fold 610. The surface segments of the flexible substrate 2 on each side of the crest of the respective folds are brought into mutual contact. Furthermore, the two valley folds 611, 612 are oblique folds, i.e. they extend in an angle different from zero degrees with either of the longitudinal axis L and the transversal axis T, while the mountain fold 610 is a straight fold. Thereby the flexible substrate 2 is folded in such a way that the plurality of LEDs 31, 32 is maintained extending along the longitudinal direction L of the flexible substrate 2 and that the main direction in which the light output surface 321 of at least one LED 32 of the plurality of LEDs faces is rotated around the longitudinal axis L of the flexible substrate 2 over an angle θ with respect to the main direction in which the light output surface 311 of at least one other LED 31 of the plurality of LEDs 31, 32 faces.

The folded flexible substrate 2 with the LEDs 31, 32 mounted thereon is encapsulated in a first rigid encapsulation 4 in such a manner that the flexible substrate 2 including the fold combination 6 and thereby the provided orientation of the plurality of LEDs 31, 32 is frozen or fixed by first rigid encapsulation 4. To this end the first rigid encapsulation 4 may e.g. be hardened or cured. The left hand side of FIG. 1B shows the first rigid encapsulation 4 before being cured. The right hand side of FIG. 1B shows the first rigid encapsulation 4 after being cured.

The first rigid encapsulation 4 is made of a suitable polymer material. Non-limiting examples are an acrylate, which may be cured by UV light using an initiator, and a silicone, which may be cured by exposure to heat.

FIGS. 2A and 2B illustrate an embodiment in which the flexible substrate 2 generally is provided with a fold combination in such a way that the plurality of LEDs 31, 32 is maintained extending along the longitudinal direction L of the flexible substrate 2 and that the main direction in which the light output surface 321 of at least one LED 32 of the plurality of LEDs faces is rotated around the transversal axis T of the flexible substrate 2 over an angle θ with respect to the main direction in which the light output surface 311 of at least one other LED 31 of the plurality of LEDs 31, 32 faces. Only one fold of the fold combination, namely a valley fold, is visible on FIGS. 2A and 2B.

In general, and irrespective of the embodiment, the angle θ is equal to or larger than 30°. Feasible values for the angle θ may be selected from the group comprising 30°, 45°, 60°, 90°, 120°, 135°, 150° 180°, 270° and 360°. In the embodiment shown in FIGS. 2A and 2B the angle θ is 90°. Similarly, in FIGS. 1A and 1B the LEDs 31 and 32 are brought to emit light in mutually opposite directions, and the angle θ is thus 180°.

Alternatively, the flexible substrate is folded to comprise such a predetermined orientation that several LEDs of the plurality of LEDs mounted on the flexible substrate is positioned with their respective light emitting surfaces positioned in an angle θ with respect to the respective light emitting surfaces of the remaining LEDs of the plurality of LEDs.

FIGS. 2A and 2B further illustrate that by way of example the flexible substrate 2 may be folded using a clamping device 16 brought into engagement with an end of the flexible substrate 2. This applies irrespective of whether the flexible substrate 2 is folded around the transversal axis T or the measured around the longitudinal axis L.

In the following different further embodiments of a light emitting device will be described, each only with respect to the features by which it differs from the embodiment shown in FIGS. 1A and 1B and described above. It is noted that the various features described below are all optional and may thus be combined as desired and needed according to purpose.

Turning first to FIG. 3, a side view of a second embodiment of a light emitting device 100 according to the invention is shown. The light emitting device 100 comprises six LEDs 31, 32, 33, 34, 35, 36. The flexible substrate 2 is provided with several separate fold combinations such as to be folded around the longitudinal axis L such that the LEDs are positioned at different angles in an alternating way. More particularly, to obtain the orientation of the flexible substrate illustrated in FIG. 3, the flexible substrate 2 is provided with three fold combinations, provided between LEDs 32 and 33, LEDs 33 and 34 and LEDs 34 and 35, respectively. Thus, the flexible substrate 2 is folded to comprise such a predetermined orientation that the LEDs 31-36 are positioned creating a gradient in a lighting distribution.

Turning now to FIG. 4, a side view of a third embodiment of a light emitting device 101 according to the invention is shown. The light emitting device 101 comprises four LEDs 31, 32, 33, 34. The flexible substrate 2 of the light emitting device 101 is folded around the longitudinal axis L in three positions and therefore comprises three fold combinations 6, 7 and 8, each comprising three folds, namely two valley folds and one mountain fold, where the surface segments of the flexible substrate 2 on each side of the crest of the mountain fold is not brought into mutual contact. More particularly, the angle θ measured around the longitudinal axis L is varied along the length of the flexible substrate, such that the angle θ between neighboring LEDs is always 90°, and such that the angle θ between the first LED 31 and the second LED 32 is 90°, the angle θ between the first LED 31 and the third LED 33 is 180° and the angle θ between the first LED 31 and the fourth LED 34 is 270°. Thus, the light emitting device 101 may emit light in four different directions simultaneously.

Turning now to FIG. 5, a side view of a fourth embodiment of a light emitting device 102 according to the invention is shown. The light emitting device 102 comprises three LEDs 31, 32, 33. The flexible substrate 2 of the light emitting device 102 is folded around the transversal axis T in two positions and therefore comprises two fold combinations 6 and 7. More particularly, the flexible substrate is folded in such a way that the LEDs 32 and 33 are facing one another, i.e. the angle θ between the LEDs 32 and 33 is 180°. Furthermore, the angle θ between the LED 31 and each of the LEDs 32 and 33 is 90°.

As shown in FIG. 4 the flexible substrate 2 is folded around the transversal axis T in such a manner that at least two surface segments 61, 62 and 71, 72, respectively, of the same surface of the flexible substrate 2 are brought into mutual contact. The same applies to all embodiments described herein with the exception of that of FIGS. 2A and 2B, and irrespective of whether the flexible substrate 2 is folded around the transversal axis T or the longitudinal axis L. It is noted that the two surface segments 61, 62 and 71, 72, respectively, together with the respective crest between the two said surface segments illustrate a mountain fold.

Turning now to FIG. 6, a side view of a fifth embodiment of a light emitting device 103 according to the invention is shown. The light emitting device 103 comprises three LEDs 31, 32, 33. The flexible substrate 2 of the light emitting device 103 comprises a perforation 12. The flexible substrate 2 is folded in one position and therefore comprises one fold combination 6. More particularly, the flexible substrate 2 is folded is such a way that one of the LEDs, particularly the LED 32, is positioned in the perforation 12 and that the angle θ between the LED 32 and the LEDs 31 and 33, respectively, is 180°.

Figure 7:
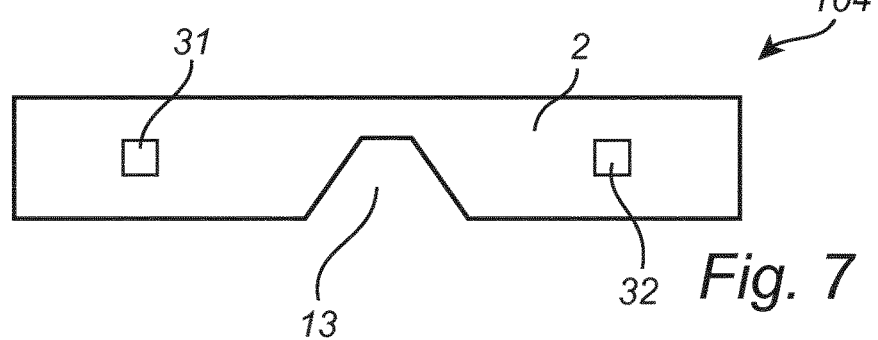
FIG. 7 shows a top view of a sixth embodiment of a light emitting device according to the invention, the encapsulation being omitted for the sake of simplicity.

Turning now to FIG. 7, a top view of a sixth embodiment of a light emitting device 104 according to the invention is shown. The rigid encapsulation is for the sake of simplicity not shown on FIG. 7. The light emitting device 104 comprises two LEDs 31 and 32. The flexible substrate 2 of the light emitting device 103 comprises a recess 13. The flexible substrate 2 may in a manner similar to the embodiment shown in FIG. 6 comprise one fold combination and thus be folded in one position and in such a way that one of the LEDs 31 and 32 is positioned in the recess 13 and for instance such that the angle θ between the LEDs 31 and 32 is 180°.

Figure 8:
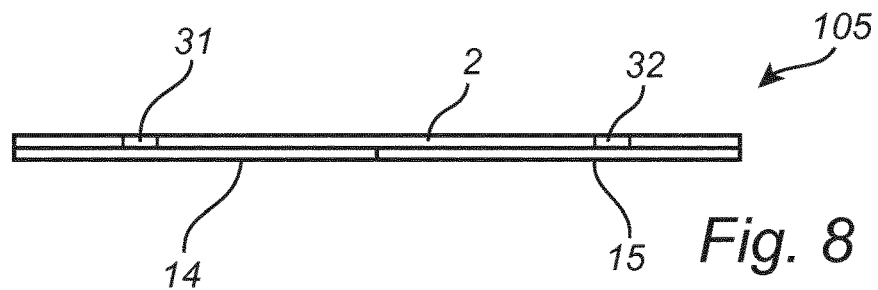
FIG. 8 shows a side view of a seventh embodiment of a light emitting device according to the invention, the encapsulation being omitted for the sake of simplicity.

Turning now to FIG. 8, a side view of a seventh embodiment of a light emitting device 105 according to the invention is shown. The rigid encapsulation is for the sake of simplicity not shown on FIG. 8. The light emitting device 105 comprises two LEDs 31 and 32. In the embodiment shown the flexible substrate 2 is on one side provided with a metal coating or layer 14 and a reflective coating or layer 15. The layer or coating may extend over the whole surface of the flexible substrate 2 or over just a part of the surface of the flexible substrate 2. Alternatively, the flexible substrate 2 may be provided with either a metal coating or layer 14 or a reflective coating or layer 15. The metal coating or layer 14 may for example be a coating or layer of aluminum or silver. The reflective coating or layer 15 may for example be a layer or coating of a highly reflective material such as $Al_2O_3$, $TiO_2$ and/or $BaSO_4$ particles in a polymer matrix.

Figure 9:
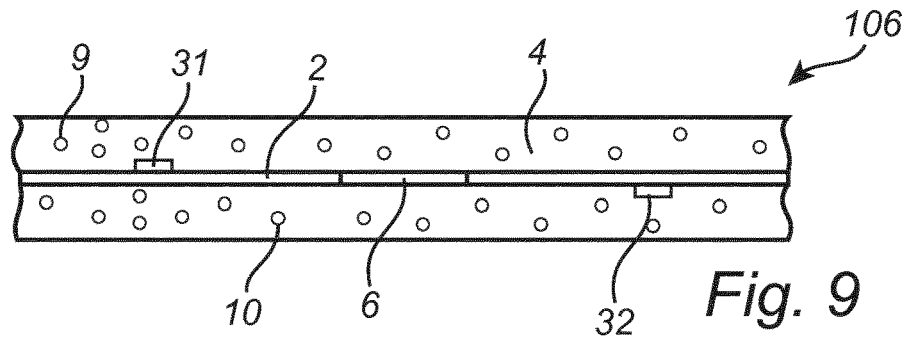
FIG. 9 shows a side view of an eighth embodiment of a light emitting device according to the invention.

Turning now to FIG. 9, a side view of an eighth embodiment of a light emitting device 106 according to the invention is shown. The light emitting device 106 comprises two LEDs 31 and 32. The flexible substrate 2 of the light emitting device 106 is folded in one position and therefore comprises one fold combination 6. The rigid encapsulation 4 of the light emitting device 106 comprises a scattering material 9 and a phosphor material 10. The scattering material 9 may for example be $Al_2O_3$, $TiO_2$ and/or $BaSO_4$ particles embedded in the rigid encapsulation 4. The phosphor material 10 may for example be an inorganic phosphor, organic phosphor or quantum dots or quantum rods incorporated into the polymer matrix of the rigid encapsulation 4. In alternative or additional embodiments the rigid encapsulation 4 may comprise any one or more of a scattering material or element 9, a phosphor material or element 10, a reflective material or element, a refractive material or element and a light converting material or element.

Figure 10:
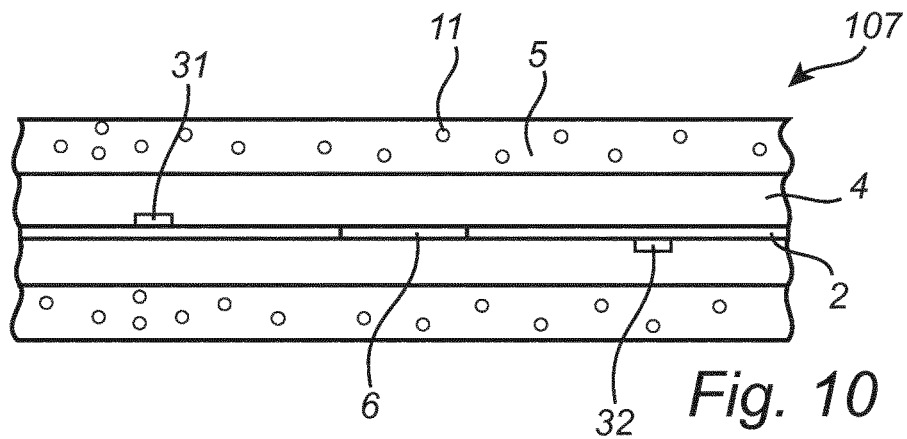
FIG. 10 shows a side view of an eighth embodiment of a light emitting device according to the invention.

Turning finally to FIG. 10, a side view of a ninth embodiment of a light emitting device 107 according to the invention is shown. The light emitting device 107 comprises two LEDs 31 and 32. The flexible substrate 2 of the light emitting device 107 is folded in one position and therefore comprises one fold combination 6. The light emitting device 107 comprises a first rigid encapsulation 4 and a second rigid encapsulation 5.

The second rigid encapsulation 5 is arranged to encapsulate the first rigid encapsulation 4. The second rigid encapsulation 5 comprises material properties differing from the material properties of the first rigid encapsulation 4. The second rigid encapsulation 5 may thus be made of a different material than the first rigid encapsulation 4 or of the same material as the first rigid encapsulation 4 but with different properties, e.g. different flexibility. The second rigid encapsulation 5 is made of a suitable polymer material, which is hardened or cured. Non-limiting examples are an acrylate, which may be cured by UV light using an initiator, and a silicone, which may be cured by exposure to heat.

The second rigid encapsulation 5 may optionally also comprise a reflective material 11. Thereby, a light emitting device 107 with a diffuse reflective partially transparent mixing chamber is obtained. Also, the second rigid encapsulation 5 may optionally, alternatively or additionally, comprise a scattering material 9 and/or a phosphor material 10 and/or a refractive material or element and/or a light converting material or element.

In alternative embodiments it may in principle also be envisaged that the second rigid encapsulation 5 comprises the same material properties as the first rigid encapsulation 4 such as to enhance the effect(s) caused by the material properties in question.

Figure 11:
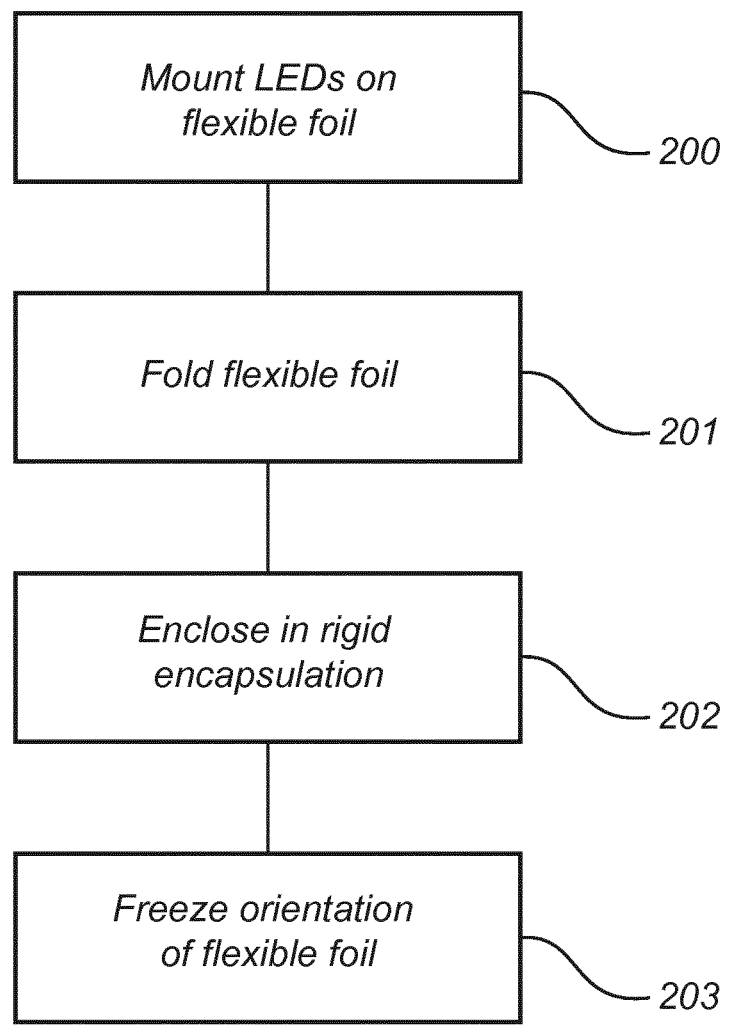
FIG. 11 is a schematic diagram illustrating steps of a method for manufacturing a light emitting device according to the invention.

Turning now to FIG. 11, a method for manufacturing a light emitting device according to the invention will be described.

In a step preceding step 200 in FIG. 11, a flexible substrate 2 and a plurality of LEDs 31, 32 adapted for, in operation, emitting light is provided.

In step 200 the plurality of LEDs 31, 32 is arranged on the flexible substrate 2 in such a way as to extend in a longitudinal direction parallel with the longitudinal axis L of the flexible substrate 2. The plurality of LEDs may for example be mounted on the flexible substrate by means of soldering or gluing.

In step 201 the flexible substrate 2 is provided with a fold combination 6 in at least one position, the fold combination 6 comprising at least two folds provided in such a way that the extension of the plurality of LEDs 31, 32 along the longitudinal direction L of the flexible substrate is maintained and that the main direction in which the light output surface 311 of at least one LED 31 of the plurality of LEDs 31, 32 faces is rotated around the longitudinal axis L or the transversal axis T of the flexible substrate 2 over an angle θ with respect to the main direction in which the light output surface 321 of at least one other LED 32 of the plurality of LEDs 31, 32 faces, and/or the pitch between two adjacent LEDs of the plurality of LEDs 31, 32 is decreased.

In an optional step 202 the folded flexible substrate 2 with the LEDs 31, 32 mounted thereon is enclosed in a first rigid polymer encapsulation 4. Finally, in likewise optional step 203, the predetermined orientation with which the flexible substrate is provided is frozen or fixed by means of the first rigid polymer encapsulation 4, which to this end optionally may be hardened or cured.

The method for manufacturing a light emitting device according to the invention may comprise one or more further steps being adapted for providing the light emitting device with one or more of the further optional features described above. Examples are one or more of the following steps.

Providing the fold combination with two folds in the form of one mountain fold and one valley fold provided in such a way that at least two surface segments of the same surface of the flexible substrate are brought into mutual contact, and that the pitch between two adjacent LEDs of the plurality of LEDs is decreased.

Providing the fold combination with at least three folds provided in such a way that at least two surface segments of the same surface of the flexible substrate are brought into mutual contact, such that the main direction in which the light output surface of at least one LED of the plurality of LEDs faces is rotated around the longitudinal axis of the flexible substrate.

Providing the fold combination with at least three folds including at least one mountain fold and at least one valley fold, and wherein at least two of the said at least three folds are oblique folds.

Folding the flexible substrate 2 around a longitudinal axis L and/or a transversal axis T of the flexible substrate to comprise such a predetermined orientation that one or more LED of the plurality of LEDs mounted on the flexible substrate is positioned in an angle θ with respect to the remaining LEDs of the plurality of LEDs.

Choosing the angle θ to be equal to or more than 30°, such as for instance to be one of 30°, 45°, 60°, 90°, 120°, 135°, 150°, 180°, 270° and 360°.

Provide the flexible substrate 2 with more than one separate fold combination in more than one separate position.

Folding the flexible substrate 2 around the longitudinal axis L and/or the transversal axis T in such a manner that at least two surface segments 61, 62 of the same surface of the flexible substrate 2 are brought into mutual contact.

Folding the flexible substrate 2 such that the LEDs of the plurality of LEDs are positioned at different angles in an alternating way.

Folding the flexible substrate 2 such that it comprises such a predetermined orientation that the LEDs of the plurality of LEDs are positioned at different angles creating a gradient in a lighting distribution.

Enclosing the folded flexible substrate 2 with the LEDs 31, 32 mounted thereon and being enclosed in a first rigid polymer encapsulation 4 in a second rigid polymer encapsulation 5, and optionally hardening or curing the second rigid polymer encapsulation 5.

Providing one or both of the first rigid polymer encapsulation 4 and the second rigid polymer encapsulation 5 with any one or more of a scattering material or element 9, a phosphor material or element 10, a reflective material or element 11, a refractive material or element and a light converting element or material.

Providing the flexible substrate 2 with any one or more of a metal coating or layer 14 and a reflective coating or layer 15.

Providing the flexible substrate 2 with any one or more of at least one perforation 12, at least one recess 13, and folding the flexible substrate 2 in such a way that at least one LED 31, 32 is arranged in the at least one perforation 12 or at least one recess 13.

The person skilled in the art realizes that the present invention by no means is limited to the preferred embodiments described above. On the contrary, many modifications and variations are possible within the scope of the appended claims.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A light emitting device comprising:
a flexible substrate defining a longitudinal direction, and a transversal direction;
a plurality of LEDs arranged on the flexible substrate such that a respective light output surface faces in a main direction perpendicular to both the longitudinal direction and the transversal direction of the flexible substrate;
at least one of a first and second fold combinations provided in the flexible substrate, the first fold combination configured such that the light output surface of at least one LED of the plurality of LEDs is rotated over an angle θ about the longitudinal direction, and a pitch between two adjacent LEDs of the plurality of LEDs is decreased, and the second fold combination configured such that at least two surface segments of the same surface of the flexible substrate are brought into mutual contact, such that the main direction in which the light output surface of at least one other LED of the plurality of LEDs faces is rotated about the transversal direction; and
a first rigid polymer encapsulation encapsulating the flexible substrate, and a second rigid polymer encapsulation encapsulating the first rigid polymer encapsulation, the first rigid polymer encapsulation and the second rigid polymer encapsulation comprising different materials.

2. A light emitting device according to claim 1, the flexible substrate provided with the first fold combination comprises two folds in the form of one mountain fold and one valley fold provided in such a way that at least two surface segments of the same surface of the flexible substrate are brought into mutual contact.

3. A light emitting device according to claim 1, at least one of the first and second fold combinations comprises at least three folds including at least one mountain fold and at least one valley fold, and wherein at least two of the said at least three folds are oblique folds.

4. A light emitting device according to claim 1, wherein the angle θ is selected from the group comprising 30°, 45°, 60°, 90°, 120°, 135°, 150° 180°, 270° and 360°.

5. A light emitting device according to claim 1, the flexible substrate comprises at least two first fold combinations arranged in at least two different predetermined positions, such that
the main direction in which the light output surface of at least some of the LEDs of the plurality of LEDs faces is rotated around the longitudinal axis of the flexible substrate over different angles θ,
such that the light emitting device provides a gradient in light distribution.

6. A light emitting device according to claim 1, wherein the flexible substrate comprises at least one of at least one perforation and at least one recess, and wherein the at least one LED of the plurality of LEDs is positioned in the at least one perforation or the at least one recess.

7. A light emitting device according to claim 1,
the second rigid polymer encapsulation comprises at least one of an acrylate cured by exposure to UV light, a silicone cured by exposure to heat, a scattering element, a phosphor element, a reflective element, a refractive element.

8. A light emitting device according to claim 1, the flexible substrate comprises at least one of a metal layer and a reflective layer.

9. A lamp or a luminaire comprising at least one housing, and a light emitting device according to claim 1 positioned within the housing.

10. A light emitting device according to claim 1, wherein the first rigid polymer encapsulation fixes the flexible substrate and at least one of the first and second fold combination in a desired orientation.

11. A light emitting device according to claim 10, the first rigid polymer encapsulation comprising at least one of an acrylate cured by exposure to UV light, a silicone cured by exposure to heat, a scattering element, a phosphor element, a reflective element, and a refractive element.

12. A method for manufacturing a light emitting device, the method comprising the steps of:
providing a flexible substrate defining a longitudinal direction, and a transversal direction;
providing a plurality of LEDs;
arranging the plurality of LEDs on the flexible substrate such a way as to extend in a longitudinal direction parallel with the longitudinal axis of the flexible substrate, and such that a respective light output surface faces a direction perpendicular to both the longitudinal direction and the transversal direction of the flexible substrate;
providing the flexible substrate with at least one fold combination in at least one predetermined position, the fold combination comprising at least two folds configured such that the light output surface of at least one LED of the plurality of LEDs is rotated an angle θ with respect to the main light output surface of at least one other adjacent LED of the plurality of LEDs, and the pitch between the two adjacent LEDs of the plurality of LEDs is decreased; and
encapsulating the flexible substrate with a first rigid polymer encapsulation, and encapsulating the first rigid polymer encapsulation with a second rigid polymer encapsulation, the first rigid polymer encapsulation and the second rigid polymer encapsulation comprising different materials.

13. A method according to claim 12, wherein the step of encapsulating the flexible substrate in the first rigid polymer encapsulation fixes the flexible substrate and the fold combination in a desired orientation.

* * * * *